United States Patent
Prandi et al.

(10) Patent No.: US 8,752,429 B2
(45) Date of Patent: *Jun. 17, 2014

(54) MICROELECTROMECHANICAL DEVICE WITH POSITION CONTROL DRIVING AND METHOD FOR CONTROLLING A MICROELECTROMECHANICAL DEVICE

(71) Applicant: STMicroelectronics S.r.l., Agrate Brianza (IT)

(72) Inventors: Luciano Prandi, Bellinzago Novarese (IT); Carlo Caminada, Rho (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 13/739,430

(22) Filed: Jan. 11, 2013

(65) Prior Publication Data

US 2013/0118256 A1    May 16, 2013

Related U.S. Application Data

(63) Continuation of application No. 12/792,599, filed on Jun. 2, 2010, now Pat. No. 8,375,789.

(30) Foreign Application Priority Data

Jun. 3, 2009 (IT) .............................. TO2009A0420

(51) Int. Cl.
*G01C 19/56* (2012.01)
(52) U.S. Cl.
USPC .................................... 73/504.12; 73/504.04

(58) Field of Classification Search
USPC ............... 73/504.02, 504.04, 504.12, 504.14, 73/504.15, 504.16, 1.77
See application file for complete search history.

(56) References Cited

U.S. PATENT DOCUMENTS

| | | | |
|---|---|---|---|
| 5,591,679 | A | 1/1997 | Jakobsen et al. |
| 5,672,949 | A | 9/1997 | Ward |
| 6,253,612 | B1 | 7/2001 | Lemkin et al. |
| 7,290,435 | B2 | 11/2007 | Seeger et al. |
| 7,305,880 | B2 | 12/2007 | Caminada et al. |
| 7,481,111 | B2 | 1/2009 | Caminada et al. |

(Continued)

OTHER PUBLICATIONS

Baschirotto, A. et al., "A+/-1-g Dual-Axis Linear Accelerometer in a Standard o.5-um CMOS Technology for High-Sensitivity Applications," IEEE Journal of Solid-State Circuits 38(7):1292-1297, Jul. 2003.

(Continued)

*Primary Examiner* — Helen Kwok
(74) *Attorney, Agent, or Firm* — Seed IP Law Group PLLC

(57) ABSTRACT

A MEMS gyroscope includes: a microstructure having a fixed structure, a driving mass, movable with respect to the fixed structure according to a driving axis, and a sensing mass, mechanically coupled to the driving mass so as to be drawn in motion according to the driving axis and movable with respect to the driving mass according to a sensing axis, in response to rotations of the microstructure; and a driving device, for keeping the driving mass in oscillation with a driving frequency. The driving device includes a discrete-time sensing interface, for detecting a position of the driving mass with respect to the driving axis and a control stage for controlling the driving frequency on the basis of the position of the driving mass.

31 Claims, 7 Drawing Sheets

(56) References Cited

U.S. PATENT DOCUMENTS

| | | |
|---|---|---|
| 8,051,698 B2 | 11/2011 | Prandi et al. |
| 8,375,789 B2 * | 2/2013 | Prandi et al. ............... 73/504.12 |
| 2001/0039834 A1 | 11/2001 | Hsu |
| 2006/0033588 A1 | 2/2006 | Caminada et al. |
| 2008/0106351 A1 | 5/2008 | Prandi et al. |
| 2008/0190198 A1 | 8/2008 | Prandi et al. |
| 2008/0190200 A1 | 8/2008 | Caminada et al. |
| 2011/0146402 A1 | 6/2011 | Donadel et al. |
| 2011/0197674 A1 | 8/2011 | Prandi et al. |
| 2011/0197675 A1 | 8/2011 | Caminada et al. |

OTHER PUBLICATIONS

Lemkin, M. et al., "A Three-Axis Micromachined Accelerometer with a CMOS Position-Sense Interface and Digital Offseet-Trim Electronics," IEEE Journal of Solid-State Circuits 34(4):456-468, Apr. 1999.

Oboe, R. et al., "Control of a Z-axis MEMS vibrational gyroscope," 8th IEEE International Workshop on Advanced Motion Control (AMC), pp. 153-158, Mar. 25-28, 2004.

\* cited by examiner

MICROELECTROMECHANICAL DEVICE WITH POSITION CONTROL DRIVING AND METHOD FOR CONTROLLING A MICROELECTROMECHANICAL DEVICE

BACKGROUND

1. Technical Field

The present disclosure relates to a microelectromechanical device with position-control driving and to a method for controlling a microelectromechanical device.

2. Description of the Related Art

As is known, the use of microelectromechanical systems (MEMS) has become increasingly widespread in various fields of technology and has yielded encouraging results especially in the construction of inertial sensors, microintegrated gyroscopes, and electromechanical oscillators for a wide range of applications.

MEMS of this type are usually based upon microelectromechanical structures comprising at least one movable mass connected to a fixed body (stator) through springs and movable with respect to the stator according to pre-determined degrees of freedom. The movable mass is moreover coupled to the fixed body via capacitive structures (capacitors). The movement of the movable mass with respect to the fixed body, for example on account of an external stress, modifies the capacitance of the capacitors, whence the possibility of getting back to the relative displacement of the movable mass with respect to the fixed body and hence back to the force applied. Vice versa, by supplying appropriate biasing voltages, it is possible to apply an electrostatic force to the movable mass to set it in motion. In addition, to produce electromechanical oscillators the frequency response of the inertial MEMS structures is exploited, which is typically of the second-order low-pass type.

Many MEMS (in particular, all the electromechanical oscillators and gyroscopes) must envisage driving devices that have the task of maintaining the movable mass in oscillation.

A first type of known solution envisages applying, in open loop, periodic stresses at the resonance frequency of the MEMS structure. The solution is simple, but also far from effective, because the resonance frequency is not known precisely on account of the non-eliminable spreads in semiconductor-micromachining processes. In addition, the resonance frequency of each individual device can vary over time, for example on account of temperature gradients or, more simply, of ageing.

Feedback driving circuits, based upon the use of sigma-delta modulators, have then been proposed. Circuits of this type are undoubtedly more effective than the previous ones in stabilizing the oscillation of the movable mass at the real resonance frequency and in suppressing disturbance. However, various stages are necessary for filtering, decimation, and further processing of the bitstream supplied by the sigma-delta modulator. For this reason, currently available feedback driving circuits are complex to produce, cumbersome and, in practice, costly.

In addition, it must be taken into account that gyroscopes have a complex electromechanical structure, which comprises two masses that are movable with respect to the stator and coupled to one another so as to have one relative degree of freedom. The two movable masses are both capacitively coupled to the stator. One of the movable masses is dedicated to driving (driving mass) and is kept in oscillation at the resonance frequency. The other movable mass (sensing mass) is drawn along in the oscillatory motion and, in the case of rotation of the microstructure with respect to a pre-set axis with an angular velocity, is subject to a Coriolis force proportional to the angular velocity itself. In practice, the sensing mass functions as an accelerometer that enables sensing of the Coriolis acceleration.

In order to enable driving and provide an electromechanical oscillator in which the sensor performs the role of frequency-selective amplifier, with second-order transfer function of a low-pass type and high figure of merit, the driving mass is provided with two types of differential capacitive structures: driving electrodes and drive-sensing electrodes. The driving electrodes have the purpose of supporting the self-oscillation of the movable mass in the driving direction, through electrostatic forces generated by the spectral component of the noise at the mechanical resonance frequency of the driving mass. The drive-sensing electrodes have the purpose of measuring, through the charge transduced, the position of translation or rotation of the sensing mass in the driving direction.

U.S. Pat. No. 7,305,880, which is incorporated by reference herein in its entirety, describes a system for controlling the velocity of oscillation of the gyroscope, which comprises a differential read amplifier, a high-pass amplifier, and a driving and control stage, operating in continuous-time mode. This system, albeit operating satisfactorily, may however undergo improvements as regards its overall dimensions.

U.S. Application Publication No. 2008/0190198, which is incorporated by reference herein in its entirety, describes an improvement of the above control system, in which the control loop comprises a low-pass filter having the purpose of reducing the offset and effects of parasitic components and couplings, operating on the overall gain and phase of the feedback loop.

BRIEF SUMMARY

Embodiments of the present disclosure include a microelectromechanical gyroscope and a method for controlling a microelectromechanical gyroscope that are precise and reliable and are suitable for exploitation on a wide scale.

According to the present disclosure, a microelectromechanical gyroscope and a method for controlling a microelectromechanical gyroscope are provided, as claimed in claim 1 and claim 15, respectively.

BRIEF DESCRIPTION OF THE SEVERAL VIEWS OF THE DRAWINGS

For a better understanding of the disclosure, some embodiments thereof will now be described, purely by way of non-limiting example and with reference to the attached drawings, wherein.

DETAILED DESCRIPTION

Figure 1:
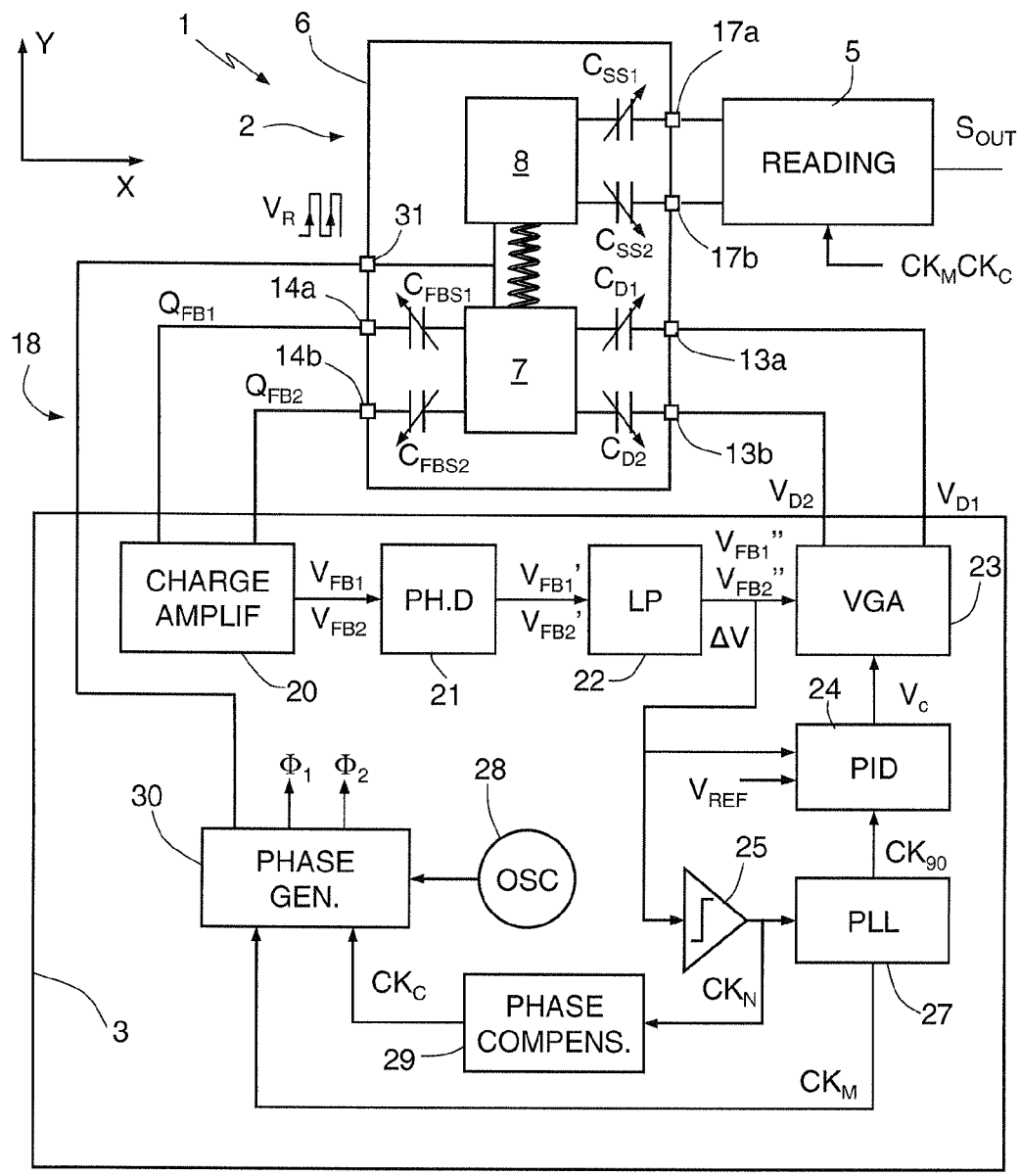
FIG. 1 is a simplified block diagram of a microelectromechanical gyroscope according to a first embodiment of the present disclosure.

FIG. 1 shows as a whole a microelectromechanical gyroscope 1, which comprises a microstructure 2, made of semiconductor material, a driving device 3, and a reading device 5.

The microstructure 2 is made of semiconductor material and comprises a fixed structure 6, a driving mass 7, and at least one sensing mass 8. For simplicity, in the embodiment illustrated herein, reference will be made to the case of a uniaxial gyroscope, in which a single sensing mass 8 is present. What is described hereinafter applies, however, also to the case of multiaxial gyroscopes, which comprise two or more sensing masses, for detecting rotations according to respective independent axes.

The driving mass 7 is elastically constrained to the fixed structure 6 so as to be able to oscillate about a rest position according to one, translatory or rotary, degree of freedom. The sensing mass 8 is mechanically coupled to the driving mass 7 so as to be drawn in motion according to the degree of freedom of the driving mass 7 itself. In addition, the sensing mass 8 is elastically constrained to the driving mass 7 so as to oscillate in turn with respect to the driving mass 7 itself, with a respective further degree of freedom.

In the embodiment described herein, in particular, the driving mass 7 is linearly movable along a driving axis X, while the sensing mass 8 is movable with respect to the driving mass 7 according to a sensing axis Y perpendicular to the driving axis X. It is understood, however, that the type of movement (translatory or rotary) enabled by the degrees of freedom, and the arrangement of the driving and sensing axes can vary according to the type of gyroscope.

In addition, the driving mass 7 (with the sensing mass 8) is connected to the fixed structure 6 so as to define a resonant mechanical system with a resonance frequency $\omega_R$ (according to the driving axis X).

Figure 2:
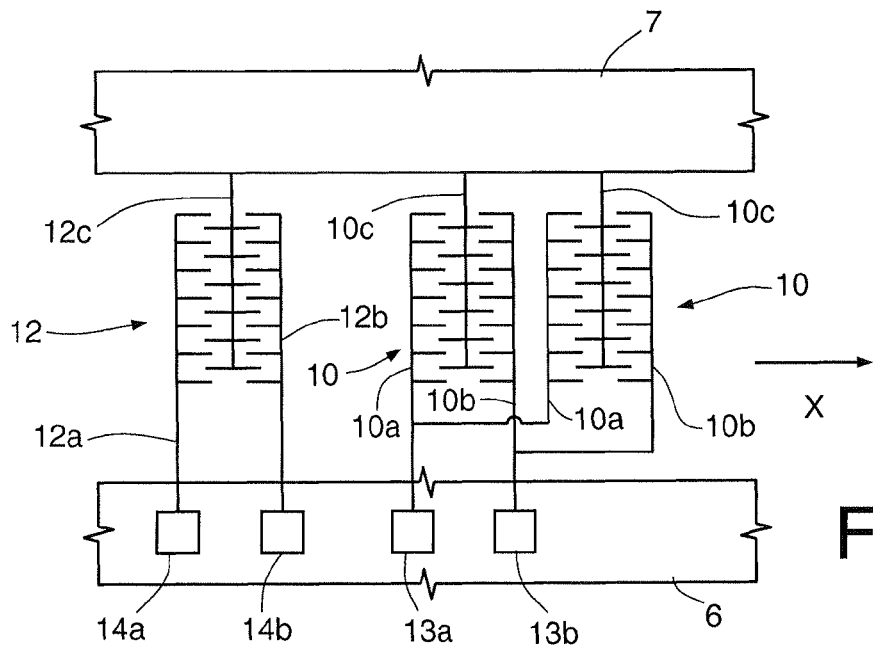
FIG. 2 is a top plan view of an enlarged detail of the gyroscope of FIG. 1.

The driving mass 7 (FIG. 2) is capacitively coupled to the fixed structure 6 by driving units 10 and feedback-sensing units 12. The capacitive coupling is of a differential type.

In greater detail, the driving units 10 comprise first and second fixed driving electrodes 10a, 10b, anchored to the fixed structure 6 and extending substantially perpendicular to the driving direction X, and movable driving electrodes 10c, which are anchored to the driving mass 7 and are also substantially perpendicular to the driving direction X. The movable driving electrodes 10c are combfingered and capacitively coupled with respective first fixed driving electrodes 10a and second fixed driving electrodes 10b. In addition, the first and second fixed driving electrodes 10a, 10b of the driving units 10 are electrically connected, respectively, to a first driving terminal 13a and to a second driving terminal 13b of the microstructure 2. As has been mentioned, moreover, the coupling is of a differential type. In other words, in each driving unit 10a movement of the driving mass 7 along the driving axis X determines the increase of the capacitance between the movable driving electrode 10c and one of the fixed driving electrodes 10a, 10b. The capacitance between the movable driving electrode 10c and the other of the fixed driving electrodes 10a, 10b decreases, instead, accordingly.

The structure of the feedback-sensing units 12 is similar to that of the driving units 10. In particular, the feedback-sensing units 12 comprise first and second fixed sensing electrodes 12a, 12b, anchored to the fixed structure 6, and movable sensing electrodes 12c, anchored to the driving mass 7 and combfingered and capacitively coupled with respective first fixed sensing electrodes 12a and second fixed sensing electrodes 12b. In addition, the first and second fixed sensing electrodes 12a, 12b of the feedback-sensing units 12 are electrically connected, respectively, to a first feedback-sensing terminal 14a and to a second feedback-sensing terminal 14b of the microstructure 2.

Hence, in practice, the driving mass 7 is coupled to the driving terminals 13a, 13b through differential driving capacitances $C_{D1}$, $C_{D2}$ and to the sensing terminals 14a, 14b through differential feedback-sensing capacitances $C_{FBS1}$, $C_{FBS2}$.

Figure 3:
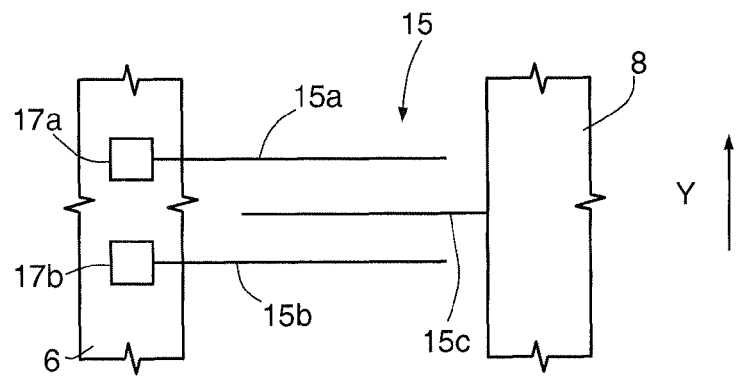
FIG. 3 is a top plan view of a further enlarged detail of the gyroscope of FIG. 1.

The sensing mass 8 is capacitively coupled to the fixed structure 6 through signal-sensing units 15 (FIG. 3). More precisely, the signal-sensing units 15 comprise third and fourth fixed sensing electrodes 15a, 15b, anchored to the fixed structure 6, and movable sensing electrodes 15c, anchored to the sensing mass 8 and arranged between respective third fixed sensing electrodes 15a and fourth fixed sensing electrodes 15b. Also in this case, the capacitive coupling is of a differential type, but is obtained through parallel-plate electrodes, perpendicular to the sensing direction Y. In addition, the third and fourth fixed sensing electrodes 15a, 15b of the signal-sensing units 15 are electrically connected, respectively, to a first signal-sensing terminal 17a and to a second signal-sensing terminal 17b of the microstructure 2. In practice, the sensing mass 8 is coupled to the signal-sensing terminals 17a, 17b through signal-sensing differential capacitances $C_{SS1}$, $C_{SS2}$.

With reference once again to FIG. 1, the driving device 3 is connected to the driving terminals 13a, 13b and to the feedback-sensing terminals 14a, 14b of the microstructure 2 so as to form, with the driving mass 7, an oscillating microelectromechanical loop 18, with control of position of the driving mass 7. In greater detail, the driving device 3 comprises a charge amplifier 20, a phase-shift module 21, a low-pass filter 22, a variable-gain amplifier 23, a controller 24, a comparator 25 and a phase-locked-loop (PLL) circuit 27. In addition, an oscillator 28, a phase-compensator module 29, and a phase generator 30, controlled by the PLL circuit 27, supply timing signals for the driving device 3 and for the reading device 5.

The microelectromechanical loop 18 is of a hybrid type. The charge amplifier 20 is in fact configured to operate in discrete-time mode, while the low-pass filter 22 and the variable-gain amplifier 23 operate in continuous-time mode. The phase-shift module 21 carries out the conversion from discrete-time mode to continuous-time mode, as will be seen hereinafter. In addition, the charge amplifier 20 defines a sensing interface for detecting the position x of the driving mass 7 with respect to the driving axis X. The remaining components of the driving device 3 co-operate for controlling, on the basis of the position x of the driving mass 7, the amplitude of oscillation of the microelectromechanical loop 18, in particular the amplitude of oscillation of the driving mass 7, and keep it close to a reference amplitude $X_{REF}$ (FIG.

8). The reference amplitude $X_{REF}$ is in particular determined by a reference voltage $V_{REF}$, which is supplied to the controller 24.

The charge amplifier 20, which is of a fully-differential type and has inputs respectively connected to the first feedback-sensing terminal 14a and to the second feedback-sensing terminal 14b, defines a sensing interface for detecting the position x of the driving mass 7 with respect to the driving axis X. In particular, the charge amplifier 20 carries out a discrete-time reading of the position x of the driving mass 7 of the microstructure 2 and, as will be explained hereinafter, is configured to minimize the signal components due to the velocity x' of the driving mass 7 itself. In practice, the charge amplifier 20 receives differential feedback charge packets $Q_{FB1}$, $Q_{FB2}$ from the feedback-sensing terminals 14a, 14b of the microstructure 2 and converts them into feedback voltages $V_{FB1}$, $V_{FB2}$, which indicate the position x of the driving mass 7.

The phase-shift module 21 is cascade-connected to the charge amplifier 20 and introduces a phase shift that is as close as possible to 90° and in any case comprised in the interval 90°±40°. In one embodiment, the phase-shift module 21 comprises a sample-and-hold circuit and is moreover configured to carry out a first filtering of a low-pass type. Phase-shifted feedback voltages $V_{FB1}'$, $V_{FB2}'$ supplied by the phase-shift module 21 are then delayed and attenuated with respect to the feedback voltages $V_{FB1}$, $V_{FB2}$. The phase-shifted feedback voltages $V_{FB1}'$, $V_{FB2}'$ have substantially step-like variations.

The low-pass filter 22 is arranged downstream of the phase-shift module 21, is a second-order fully-differential filter, and supplies filtered feedback voltages $V_{FB1}''$, $V_{FB2}''$ that vary with continuity in time. The cut-off frequency of the low-pass filter 22 is selected in such a way that the frequency of oscillation of the microelectromechanical loop 18, in what follows referred to as driving frequency, $\omega_D$, will be included in the passband and in such a way that the phase of the useful signal indicating the position x of the driving mass 7 will not be substantially altered. In addition, the passband of the low-pass filter 22 is such that the undesirable signal components, linked to the sampling through discrete-time reading, will be attenuated by at least 30 dB.

In order to prevent offsets that might jeopardize control of the oscillations of the microelectromechanical loop 18, both the phase-shift module 21 and the low-pass filter 22 are based upon amplifiers provided with autozero function.

Figure 8:
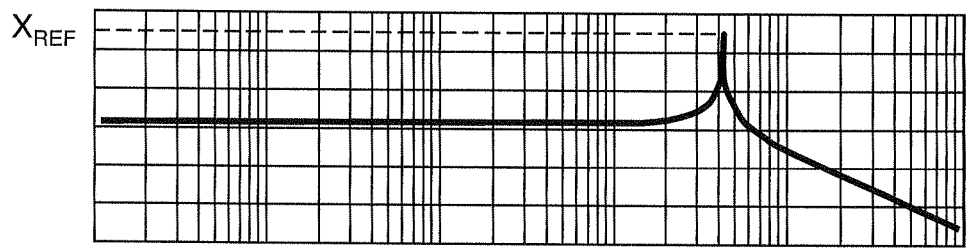
FIGS. 8 and 9 are diagrams showing, respectively, the magnitude and phase corresponding to a micromechanical part of the gyroscope of FIG. 1.

The variable-gain amplifier 23 is of a continuous-time fully-differential type, is cascaded to the low-pass filter 22, and has outputs connected to the driving terminals 13a, 13b of the microstructure 2 so as to supply driving voltages $V_{D1}$, $V_{D2}$ such as to support the oscillation of the microelectromechanical loop 18 at the driving frequency $\omega_D$, close to the mechanical resonance frequency $\omega_R$ of the microstructure 2. For this purpose, the gain G of the variable-gain amplifier 23 is determined by the controller 24 by a control signal $V_C$ correlated to the filtered feedback voltages $V_{FB1}''$, $V_{FB2}''$ supplied by the low-pass filter 22. The controller 24 is, for example, a discrete-time PID controller. In particular, the gain G is determined so as to maintain the conditions of oscillation of the microelectromechanical loop 18 (unit loop gain, and phase shift that is an integer multiple of 360°). For this purpose, the controller 24 receives at input the reference voltage $V_{REF}$, which indicates the desired reference oscillation amplitude $X_{REF}$ (FIG. 8).

In greater detail, the comparator 25 receives the difference $\Delta V$ between the filtered feedback voltages $V_{FB1}''$, $V_{FB2}''$ from the low-pass filter 22 and switches at each zero crossing.

The output of the comparator 25, which supplies a native clock signal $CK_N$, is connected to an input of the PLL circuit 27, so as to enable phase locking with the microelectromechanical loop 18.

The PLL circuit 27 supplies a master clock signal $CK_M$ and a quadrature clock signal $CK_{90}$. The master clock signal $CK_M$ has a frequency equal to an integer multiple of the frequency of the native clock signal $CK_N$. If $\omega_{CKM}$ is the frequency of the master clock signal $CK_M$, and $\omega_{CKN}$ is the frequency of the native clock signal $CK_N$, we hence have $\omega_{CKM}=M\omega_{CKN}$, for example with $M=2^{10}$.

The quadrature clock signal $CK_{90}$ is phase-shifted 90° with respect to the native clock signal $CK_N$ and is used for timing the controller 24.

The phase-compensator module 29 receives the native clock signal $CK_N$ from the comparator 25 and processes it so as to remove the phase error (advance or delay) introduced by the phase-shift module 21 and by the low-pass filter 22. The phase-compensator module 29 hence generates a compensated clock signal $CK_C$ synchronous in frequency and in phase with the oscillations of the driving mass 7.

The phase generator 30 receives the master clock signal $CK_M$ and the compensated clock signal $CK_C$ and uses them for generating the timing signals for the discrete-time components and, more in general, for proper operation of the gyroscope 1.

Figure 4:
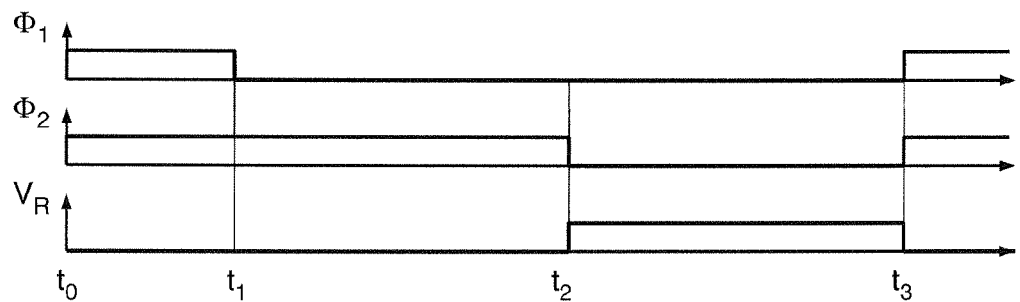
FIG. 4 is a graph of signals used in the gyroscope of FIG. 1.

In particular, the phase generator 30 supplies a reading signal $V_R$, which is applied to the driving mass 7 and to the sensing mass 8 through a reading terminal 31 of the microstructure 2, and a first timing signal $\Phi_1$ and a second timing signal $\Phi_2$. In steady-state conditions, the reading signal $V_R$ and the timing signals $\Phi_1$, $\Phi_2$ are generated starting from the master clock signal $CK_M$ and from the compensated clock signal $CK_C$ and have a frequency that is a multiple of the driving frequency $\omega_D$ of the microelectromechanical loop 18 (for example, equal to $40\omega_D$). In a start-up step of the gyroscope 1, however, the base for generation of the reading signal $V_R$ and of the timing signals $\Phi_1$, $\Phi_2$ is a high-frequency asynchronous signal CK produced by the oscillator 28. The time correlation between the reading signal $V_R$ and the timing signals $\Phi_1$, $\Phi_2$ is illustrated in FIG. 4 and is defined to provide read and control cycles according to the correlated double-sampling (CDS) technique. In particular, the first and second timing signals $\Phi_1$, $\Phi_2$ are high in a first fraction of each cycle (approximately one fifth of the period, reset step). Then, the first timing signal $\Phi_1$ switches and the situation is kept unvaried for a second fraction of the period (approximately two fifths, offset-sampling step; by "offsets" are meant here and in what follows both the static offsets and the contributions of flicker noise associated to the various components). Finally, the second timing signal $\Phi_2$ switches and is kept stable during the third and last fraction of the period (once again two fifths, sense step). The reading signal $V_R$ has rise and fall edges at the start and at the end, respectively, of the sense step of each cycle. The use of the reading signal $V_R$ and of the timing signals $\Phi_1$, $\Phi_2$ will be described in detail hereinafter. In one embodiment, moreover, the reading signal $V_R$ is a voltage that varies between 0 V and $2V_{CM}$, where $V_{CM}$ is a common-mode voltage for the components of the microelectromechanical loop 18.

The reading device 5 is of the discrete-time open-loop type and, in the embodiment described herein, is configured to carry out a so-called "double-ended" reading of the displacements of the sensing mass 8 according to the respective degree of freedom (in particular, for detecting a position y of the sensing mass along the sensing axis Y). In particular, the reading device 5 has inputs connected to the signal-sensing terminals 17a, 17b of the microstructure 2 and an output 5a, which supplies an output signal $S_{OUT}$, correlated to the angular velocity Ω of the microstructure 2.

Figure 5:
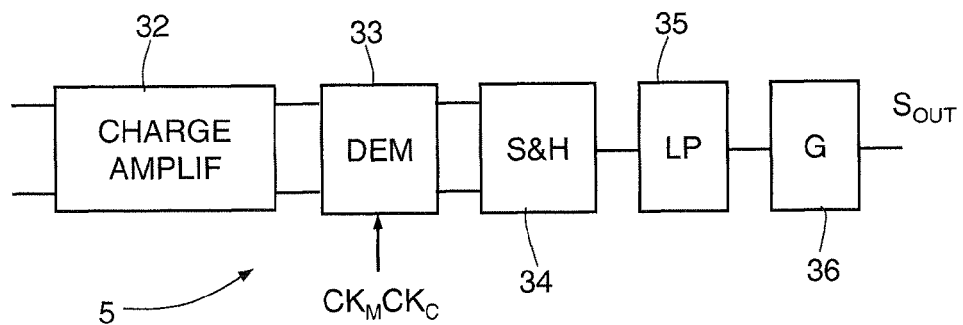
FIG. 5 is a simplified circuit diagram corresponding to a first component of the gyroscope of FIG. 1.

As is shown in FIG. 5, in one embodiment the reading device 5 comprises a charge amplifier 32, a demodulator 33, which receives the master clock signal $CK_M$ and the compensated clock signal $CK_C$, a sample-and-hold (S&H) stage 34, a low-pass filter 35, and an output amplifier 36, connected to one another in cascaded fashion. The components of the reading device 5 are of the switched-capacitor fully-differential type.

The gyroscope 1 operates in the way hereinafter described. The driving mass 7 is set in oscillation along the driving axis X by the driving device 3.

The sensing mass 8 is drawn in motion along the driving axis X by the driving mass 7. Consequently, when the microstructure 2 rotates about a gyroscopic axis perpendicular to the plane of the axes X, Y with a certain instantaneous angular velocity Ω, the sensing mass 8 is subject to a Coriolis force, which is parallel to the sensing axis Y and is proportional to the angular velocity Ω of the microstructure 2 and to the velocity of the two masses 7, 8 along the driving axis X. More precisely, the Coriolis force ($F_C$) is given by the equation:

$$F_C = 2 M_S \Omega x'$$

where $M_S$ is the value of the sensing mass 8, Ω is the angular velocity of the microstructure 2, and x' is the velocity of the two masses 7, 8 along the driving axis X. The velocity x' varies sinusoidally at the driving frequency $\omega_D$, with a phase shift of 90° with respect to the position x along the driving axis X and amplitude that are substantially constant as the temperature varies (the variations are usually less than 1%). The displacements to which the sensing mass 8 is subject on account of the Coriolis force are read through the signal-sensing units 15 (FIG. 3) and the reading device 5. In response to the excitation of the sensing mass 8 by the reading signal $V_R$, the signal-sensing units 15 transfer to the charge amplifier 32 differential sensing charge packets $Q_{RS1}$, $Q_{RS2}$, which are proportional to the capacitive unbalancing caused by the displacement of the sensing mass 8 along the sensing axis Y. The sensing charge packets $Q_{RS1}$, $Q_{RS2}$ are hence correlated to the Coriolis force and to the instantaneous angular velocity Ω of the microstructure 2. The sensing charge packets $Q_{RS1}$, $Q_{RS2}$ are converted and processed by the reading device 5 for generating the reading signal $S_{OUT}$, which indicates the angular velocity Ω (see also FIG. 5).

The controller 24, the comparator 25, and the PLL circuit 27 co-operate with the phase-shift module 21, the low-pass filter 22, and the variable-gain amplifier 23 to create and maintain the conditions of oscillation of the microelectromechanical loop 18 in different steps of operation of the gyroscope 1.

In particular, in a step of triggering of the oscillations (for example upon switching-on of the gyroscope 1), the controller 24 keeps the gain G of the variable-gain amplifier 23 at the maximum value. In this way, even the presence of a minimal noise it is sufficient to trigger the oscillations, which are progressively amplified. In addition, the output of the low-pass filter 22 is low and hence the comparator 25 would not manage to discriminate zero crossing. The PLL circuit is disabled in this step, and the timing signals are generated starting from the oscillator 30.

When, that is, the output of the comparator 25 is sufficiently stable in frequency, the PLL circuit 27 is enabled and synchronizes in frequency and phase to its signal input (i.e., the output of the comparator 25) and supplies the master clock signal $CK_M$, which has a frequency that is a multiple of the driving frequency $\omega_D$. From this moment on, all the steps of the switched-capacitor blocks of the system are synchronous in phase and frequency to the velocity of the sensor at the driving frequency $\omega_D$.

In steady-state conditions, the controller 24 operates on the gain G of the variable-gain amplifier 23 tracking the resonance and keeping the amplitude of the displacement constant in such a way that the conditions of oscillation of the microelectromechanical loop 18 (Barkhausen condition) will be respected.

In addition, the controller 24 intervenes following upon external shocks impressed upon the movable mass reducing the gain G of the variable-gain amplifier 23 to prevent both the non-linearities of the sensor, which can trigger limit cycles, and phenomena of adhesion and/or stitching of the masses.

FIG. 5 shows in greater detail the structure of the charge amplifier 20 of the microelectromechanical loop 18 and a portion of the microstructure 2, in particular of the driving mass 7. The charge amplifier 20 comprises a fully-differential operational amplifier 37, with amplification capacitors 38 between a respective input and a respective output, an input common-mode control stage 39, and an output CDS stage 40. The charge amplifier 20 is moreover provided with trimming capacitors 41, having an adjustable trimming capacitance $C_{TRIM}$.

The input common-mode feedback driving stage 39 is configured to fix the feedback-sensing terminals 14a, 14b of the microstructure 2 to the common-mode voltage $V_{CM}$ and can be, for example, of the type described in "A Three-Axis Micromachined Accelerometer with a CMOS Position-Sense Interface and Digital Offset-Trim Electronics" by M. Lemkin, B. Boser, IEEE Journal of Solid-State Circuits, Vol. 34, N. 4, pp. 456-468, which is incorporated herein by reference in its entirety.

The CDS stage 40 comprises two CDS capacitors 42, having a capacitance $C_{CDS}$. The CDS capacitors 42 have first terminals connected to respective outputs of the operational amplifier 37 and second terminals defining outputs 20a, 20b of the charge amplifier 20.

In addition, the CDS stage 40 comprises a reset switch 43 and CDS switches 45. In greater detail, the reset switch 43 is arranged between the outputs of the operational amplifier 37 and is controlled by the first timing signal $\Phi_1$. The terminals of the CDS capacitors 42 that define the outputs 20a, 20b of the charge amplifier 20 are selectively connectable to a common-mode line 47, set at the common-mode voltage $V_{CM}$, through respective CDS switches 45. The CDS switches 45 are controlled by the second timing signal $\Phi_2$.

The trimming capacitors 41 each have a terminal connected, respectively, to the first feedback-sensing terminal 14a and to the second feedback-sensing terminal 14b and receive, on the other terminal, compensation signals $V_c$, $V_c'$ in phase opposition from the phase generator 30. In one embodiment, the compensation signals $V_c$, $V_c'$ are equal, respectively, to the reading signal $V_R$ and to the negated reading signal $V_R$. The trimming capacitances $C_{TRIM}$ of the trimming capacitors 41 are adjustable in the factory and enable compensation of the offsets caused by the microstructure 2 (basically, capacitive unbalancings due to process imperfections and spreads) and residual offsets of the subsequent reading chain (charge amplifier 20, phase-shift module 21, low-pass filter 22).

During the reset step (see also FIG. 4), all the switches 43, 45 are closed. In this way, the nodes of the operational amplifier 37 are fixed to the common-mode voltage $V_{CM}$, and the capacitors, in particular the CDS capacitors 42, are discharged.

In the next CDS step, the reset switch 43 is opened, and the offsets and the noise (in particular the flicker noise) associated to the operational amplifier 37 are stored on the CDS capacitors 42.

Then, in the sense step, also the CDS switches 45 are opened, and a reading pulse (i.e., a rising edge of the reading signal $V_R$) is applied to the driving mass 7 through the reading terminal 31 of the microstructure 2. The offsets, stored on the CDS capacitors 42, are in this way canceled. In addition, the undesirable signal contribution linked to the instantaneous velocity of the driving mass 7 is stored. In general, in fact, the instantaneous charge transfer from the microstructure 2 through one of the differential feedback-sensing capacitances $C_{FBS1}$, $C_{FBS2}$ (for example, for the differential feedback-sensing capacitance $C_{FBS1}$) occurs according to the relation:

$$i_1(t) = \frac{dQ_1}{dt} = \frac{d(C_{FBS1}V_{FBS1})}{dt} = C_{FBS1}\frac{dV_{FBS1}}{dt} + V_{FBS1}x'\frac{dC_{FBS1}}{dx}$$

where $V_{FBS1}=V_{CM}-V_R$ is the voltage applied to the differential feedback-sensing capacitance $C_{FBS1}$ (the feedback-sensing terminals 14a, 14b are in fact kept at the common-mode voltage $V_{CM}$ by the input feedback stage 39 of the charge amplifier 20). It is recalled that, in each cycle, the reading signal $V_R$ is equal to 0 V in the reset and CDS steps, has a practically instantaneous transition at $2V_{CM}$ (of the duration of a few nanoseconds) and remains at the value $2V_{CM}$ during the sense step.

The component $$C_{FBS1}\frac{dV_{FBS1}}{dt}$$

depends, through the differential feedback-sensing capacitance $C_{FBS1}$, only upon the position x of the driving mass 7 and defines the useful signal for control of the oscillations of the microelectromechanical loop 18.

The component $$V_{FBS1}x'\frac{dC_{FBS1}}{dx}$$

depends upon the instantaneous velocity x' of the driving mass 7, whereas it is not correlated to the variations of the reading signal $V_R$, and represents a disturbance.

In the reset step (FIG. 4, from $t_0$ to $t_1$), the nodes of the charge amplifier 20 are forced to the common-mode voltage $V_{CM}$, and hence the contribution of the disturbance, including the signal component linked to the instantaneous velocity x' of the driving mass 7, are substantially of no effect. There is in fact no charge transfer.

In the CDS step (FIG. 4, from $t_1$ to $t_2$), the disturbance charge contribution $Q_{D1}$ due to the instantaneous velocity x' is present and is given by $$Q_{D1} = \int_{t_1}^{t_2} i(t)dt \approx V_{CM}(x'(t_2) - x'(t_1))\frac{dC_{FBS1}(t_0)}{dx}$$

The disturbance charge contribution $Q_D$ is stored on the CDS capacitors 42.

Upon transition of the reading signal $V_R$, which occurs at the start of the sense step, immediately after switching of the CDS switches 45, a signal charge packet $Q_{si}$ is generated, equal to $$Q_{S1} = 2V_{CM}\Delta C_{FBS1}(t_2).$$

In addition, during the sense step, a further disturbance charge contribution $Q_{D1}'$ is transferred:

$$Q_{D1} = \int_{t_2}^{t_3} i(t)dt \approx -V_{CM}(x'(t_3) - x'(t_2))\frac{dC_{FBS1}(t_2)}{dx}.$$

Given that the frequency of the reading signal $V_R$, and hence of the entire reading cycle, is much greater than the driving frequency $\omega_D$ (approximately 40 times in the embodiment described), the values of the instantaneous velocity x' and of the factor $dC_{FBS1}/dx$ are substantially constant during the CDS and sensing steps. Also the disturbance charge contribution $Q_{D1}'$ transferred during the sense step is hence close to the disturbance charge contribution $Q_{D1}$ stored on the CDS capacitors 42. Consequently, the use of the CDS function on the output of the operational amplifier 37 enables reduction of, and renders substantially negligible, the transfers of charge linked to the velocity x' of the driving mass 7, which represent a disturbance. The feedback voltages $V_{FB1}$, $V_{FB2}$ supplied by the charge amplifier 20 hence indicate the position x of the driving mass 7 and are purged of the contributions linked to its velocity x'. For this reason, the discrete-time reading through a charge amplifier with CDS function on the output is suited to performing effectively driving of the microelectromechanical loop 18 by a position control.

In the embodiment described, the cancellation of the components linked to the velocity x' of the driving mass 7 is particularly precise because the CDS and sensing steps, during which the disturbance charge contributions $Q_{D1}$, $Q_{D1}'$ are integrated, have the same duration and, moreover, the reading signal has values symmetrical with respect to the common-mode voltage $V_{CM}$. However, it is clear that the balancing and the consequent cancellation of the disturbance charge contributions $Q_{D1}$, $Q_{D1}'$ could be obtained also with different combinations of the parameters (duration of the CDS and sensing steps and values of the reading signal $V_R$).

Figure 6:
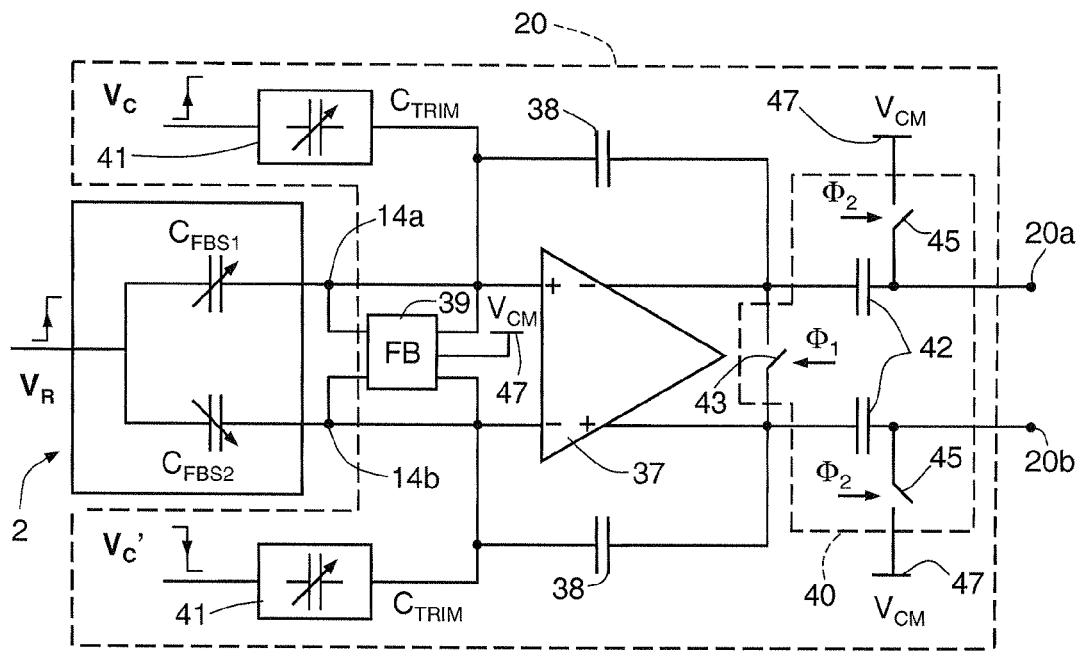
FIG. 6 is a simplified circuit diagram corresponding to a second component of the gyroscope of FIG. 1.
Figure 7:
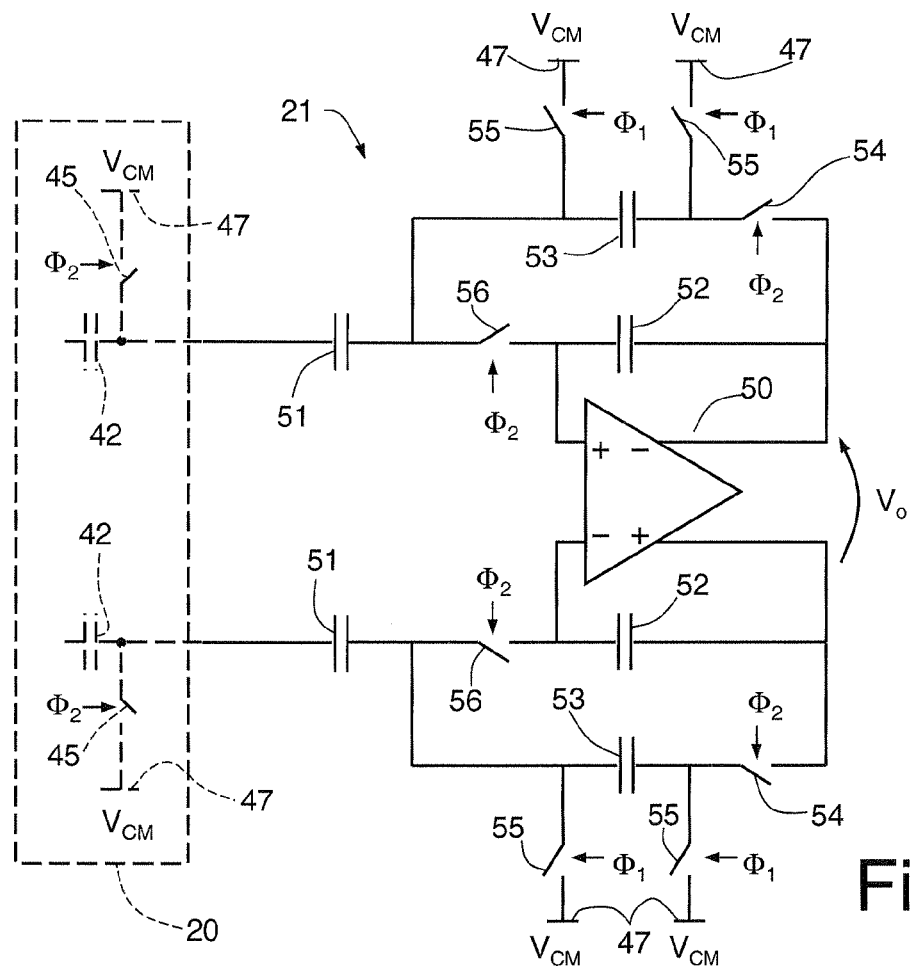
FIG. 7 is a simplified circuit diagram corresponding to a third component of the gyroscope of FIG. 1.

FIG. 6 illustrates in greater detail the phase-shift module 21, which comprises an operational amplifier 50, input capacitors 51, first and second filter capacitors 52, 53 and first, second, and third phase-shift switches 54, 55, 56.

The operational amplifier 50 is fully differential and is provided with autozero function.

The input capacitors 51 are connected between respective outputs 20a, 20b of the charge amplifier 20 and respective input nodes 57a, 57b.

The first filter capacitors 52 are set between respective inputs and respective outputs of the operational amplifier 50, which define outputs 21a, 21b of the phase-shift module 21.

The second filter capacitors 53 each have a terminal connected to a respective input node 57a, 57b and a terminal selectively connectable to a respective output 21a, 21b through one of the first phase-shift switches 54. In addition, the terminals of the second filter capacitors 53 can be selectively connected to the common-mode line 47 through respective second phase-shift switches 55.

The third phase-shift switches 56 are each connected between an input of the operational amplifier 50 and one of the input nodes 57a, 57b.

The first and third phase-shift switches 54 are controlled by the second timing signal $\Phi_2$. The second phase-shift switches 55 are controlled by the first timing signal $\Phi_1$.

During the sense step, the first phase-shift switches 54 are open, and the second phase-shift switches 55 are closed. In addition, the input capacitors 51, which in this step have terminals connected to the common-mode line 47, receive from the charge amplifier 20 and store the feedback voltages $V_{FB1}$, $V_{FB2}$.

In the reset and CDS steps of the next cycle, all the phase-shift switches 54, 55 switch, and hence the input capacitors 51 are connected to the respective inputs of the operational amplifier 50. In this way, the feedback voltages $V_{FB1}$, $V_{FB2}$ stored on the input capacitors 51 are filtered and transferred on the outputs (filtered feedback voltages $V_{FB1}'$, $V_{FB2}'$).

As previously mentioned, the phase-shift module 21 introduces a phase shift that is as close as possible to 90°. The feedback signal of the microelectromechanical loop 18 is converted into electrostatic forces for compensating the damping forces that act on the driving mass 7 and keeping the amplitude of oscillation constant. The electrostatic forces, which are produced by the driving voltages $V_{D1}$, $V_{D2}$ applied to the driving terminals 13a, 13b of the microstructure 2, should be in phase with the damping forces, which are proportional to the velocity x' of the driving mass 7, in order to maximize the amplitude of oscillation. As explained previously, the signals read by the charge amplifier 20 (feedback voltages $V_{FBS1}$, $V_{FBS2}$) are proportional to the position x of the driving mass 7 with respect to the driving axis X and hence phase-shifted by 90° with respect to the damping forces; hence the need for the phase-shift module 21. However, a difference even of some tens of degrees is in any case normally tolerable, given the frequency selectivity of the microstructure 2 (see in this connection the corresponding Bode diagrams given in FIGS. 8 and 9); an even significant phase difference entails a rather limited variation of the amplitude of oscillation, which can effectively be recovered by adapting the gain of the variable-gain amplifier 23.

The gyroscope 1 presents various advantages, deriving principally from the use of the discrete-time reading and from the position control in the microelectromechanical loop.

At the same time, the use of the same reading technique used for driving and sensing of the angular velocity (instead of a velocity control of the oscillations of the microelectromechanical loop) solves the problem of insulation of the driving mass from the sensing mass. The insulation, which would otherwise be necessary because the velocity control involves signals not compatible with the discrete-time reading, entails a considerable increase of the encumbrance and, above all, of the complexity of the fabrication process.

The position control enables verification of whether the microstructure is or not at the resonance and monitoring of the amplitude of the oscillations so as to maximize the displacement of the driving mass. The charge collected upon oscillations of the driving mass is hence maximized, with major benefits of the signal-to-noise ratio.

The signal-to-noise ratio in the microelectromechanical loop is further improved by the use of CDS techniques, which eliminate offsets and noise at low frequency. Indirectly, also the signal-to-noise ratio with respect to the sensing axis is increased.

In addition, the use of switched-capacitor components in the microelectromechanical loop makes it possible to track drifts of the resonance frequency $\omega_R$ of the microstructure due to process spreads, variations of the environmental parameters, and ageing. In fact, the position of the singularities (poles and zeros) of the transfer functions of the switched-capacitor components depends not only upon the circuit structure, but also upon the switching frequency. Since the switching frequency is defined by the timing signals, which are generated on the basis of the driving frequency $\omega_D$, variations of the driving frequency $\omega_D$ itself are automatically compensated.

Figure 9:
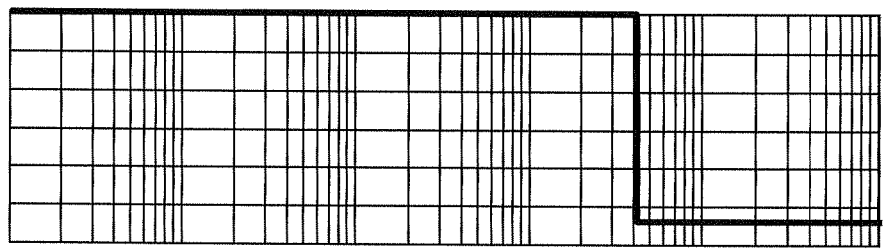
Figure 10:
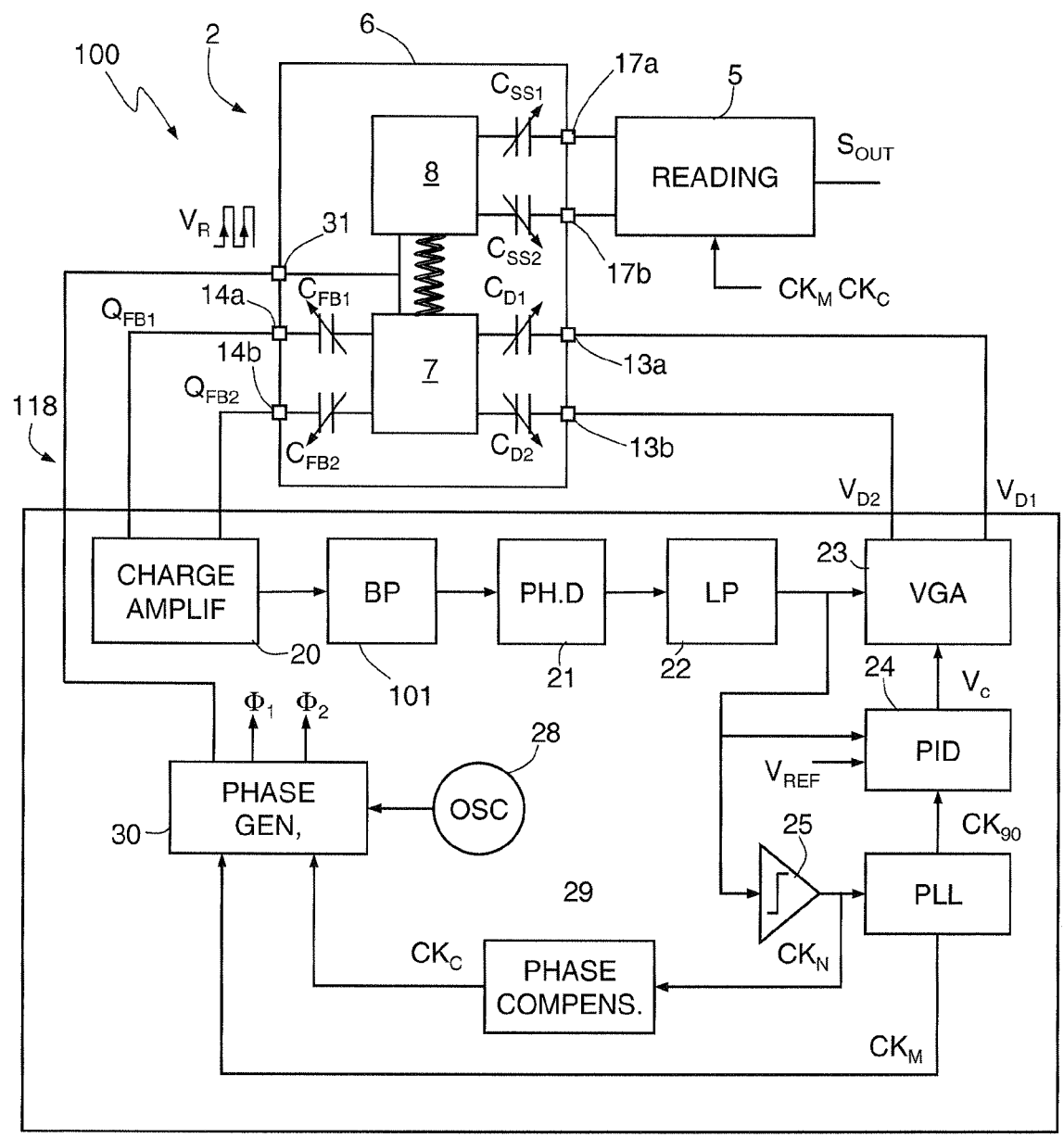
FIG. 10 is a simplified block diagram of a microelectromechanical gyroscope according to a second embodiment of the present disclosure.

A different embodiment is illustrated in FIGS. 9 and 10, where parts that are the same as the ones already shown are designated by the same reference numbers. In this case, a uniaxial gyroscope 100 comprises the microstructure 2 and the reading device 5 already described previously. In addition, the gyroscope 100 comprises a driving device 103, connected to the driving terminals 13a, 13b and to the feedback-sensing terminals 14a, 14b of the microstructure 2 so as to form, with the driving mass 7, an oscillating microelectromechanical loop 118, with control of position of the driving mass 7.

The driving device 103 comprises the charge amplifier 20, the phase-shift module 21, the low-pass filter 22, the variable-gain amplifier 23, the controller 24, the comparator 25, the PLL circuit 27, the oscillator 28, and the phase generator 30, as already described with reference to FIGS. 1-6. The driving device 103 further comprises a band-pass filter 101 of the double-output type, which uses the technique of switched capacitors and correlated double sampling.

The band-pass filter 101, which is arranged between the charge amplifier 20 and the phase-shift module 21 and is shown in detail in FIG. 10, comprises an operational amplifier 102 having a first feedback branch 102a and a second feedback branch 102b, each connected between a respective input and a respective output of the operational amplifier 102.

The feedback branches 3a and 3b are the same as one another and comprise: a first feedback capacitor $C_A$, connected between the respective input and the respective output through a respective insulation switch 104, controlled by a third phase signal $\Phi_3$, in phase opposition with respect to the second phase signal $\Phi_2$; and a second feedback capacitor $C_2$, connected in parallel to the first capacitor $C_A$. In addition, the second capacitor $C_2$ can be short-circuited through a short-circuit switch 105, controlled by the second phase signal $\Phi_2$.

The inputs of the operational amplifier 2 are moreover connected to first terminals of respective input capacitors $C_I$, which have second terminals connected to a respective output 20a, 20b of the charge amplifier 20 through coupling switches 111 controlled by the second phase signal $\Phi_2$.

The filter 101 is moreover provided with an output CDS stage 115, which comprises: two sampling capacitors 116, connected each between a respective output of the operational amplifier 2 and a respective output terminal 101a, 101b of the filter 101; and two CDS switches 117, set between a respective output 101a, 101b of the filter 101 and the common-mode line 47 and controlled by the second phase signal $\Phi_2$. In addition, a reset switch 101 is arranged between the outputs of the operational amplifier 2 and is controlled by the first phase signal $\Phi_1$.

The use of the filter 101 is particularly advantageous when considerable offsets can be associated to the microstructure 2, for example on account of process spreads. The filter 101, in fact, in combination with the CDS stage 40 of the charge amplifier 20, enables applying a high-pass filtering only to the disturbance components (offset and noise) of the preceding stage and of the microstructure 2, with a lower band limit of the order of tens of kilohertz (for example 20 kHz), while the useful signal is filtered with a passband that ranges from some tens or hundreds of hertz (for example 40 Hz) up to tens of kilohertz (for example 40 kHz). The removal of the disturbance at a low frequency is hence extremely effective.

Figure 11:
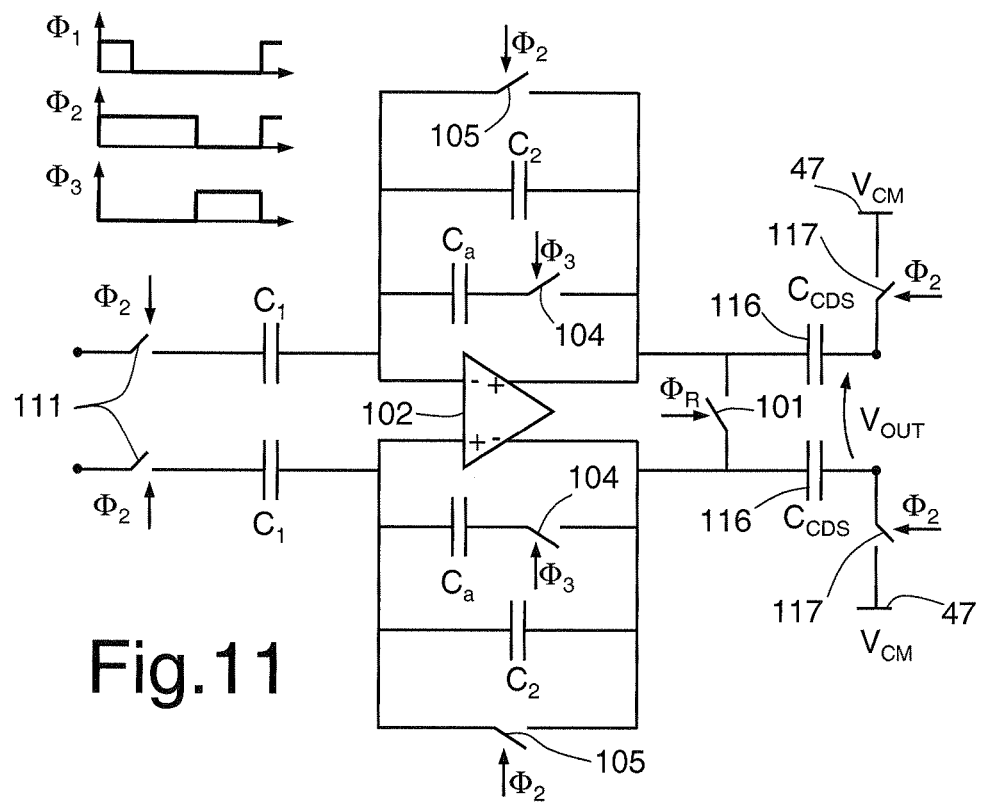
FIG. 11 is a simplified circuit diagram corresponding to a component of the gyroscope of FIG. 10.

According to the embodiment illustrated in FIG. 11, a multiaxial gyroscope 200 differs from the gyroscope 1 described with reference to FIGS. 1-6 in that the microstructure, here designated by 202, comprises a further sensing mass 9, to which a further reading device 4 is coupled.

The sensing mass 9 is mechanically coupled to the driving mass 7 so as to be drawn in motion according to the driving axis X. In addition, the sensing mass 9 is in turn elastically constrained to the driving mass 7 with a respective further degree of freedom. In particular, the sensing mass 9 is movable with respect to the driving mass 7 according to a sensing axis Z independent of the driving axis X and of the sensing axis Y. In a way similar to the sensing mass 8, the sensing mass 9 is capacitively coupled to the fixed structure 6 through signal-sensing units (here not shown for reasons of simplicity).

Also in this case, the capacitive coupling is of a differential type. In practice, the sensing mass 9 is coupled to signal-sensing terminals 19a, 19b through signal-sensing differential capacitances $C_{SS1}'$, $C_{SS2}'$.

The reading device 4, which has the same structure as the reading device 5, has inputs connected to the signal-sensing terminals 19a, 19b and supplies an output signal $S_{OUT}'$ indicating an angular velocity $\Omega'$ of the microstructure 202 about an axis perpendicular to the driving axis X and to the sensing axis Z.

Figure 12:
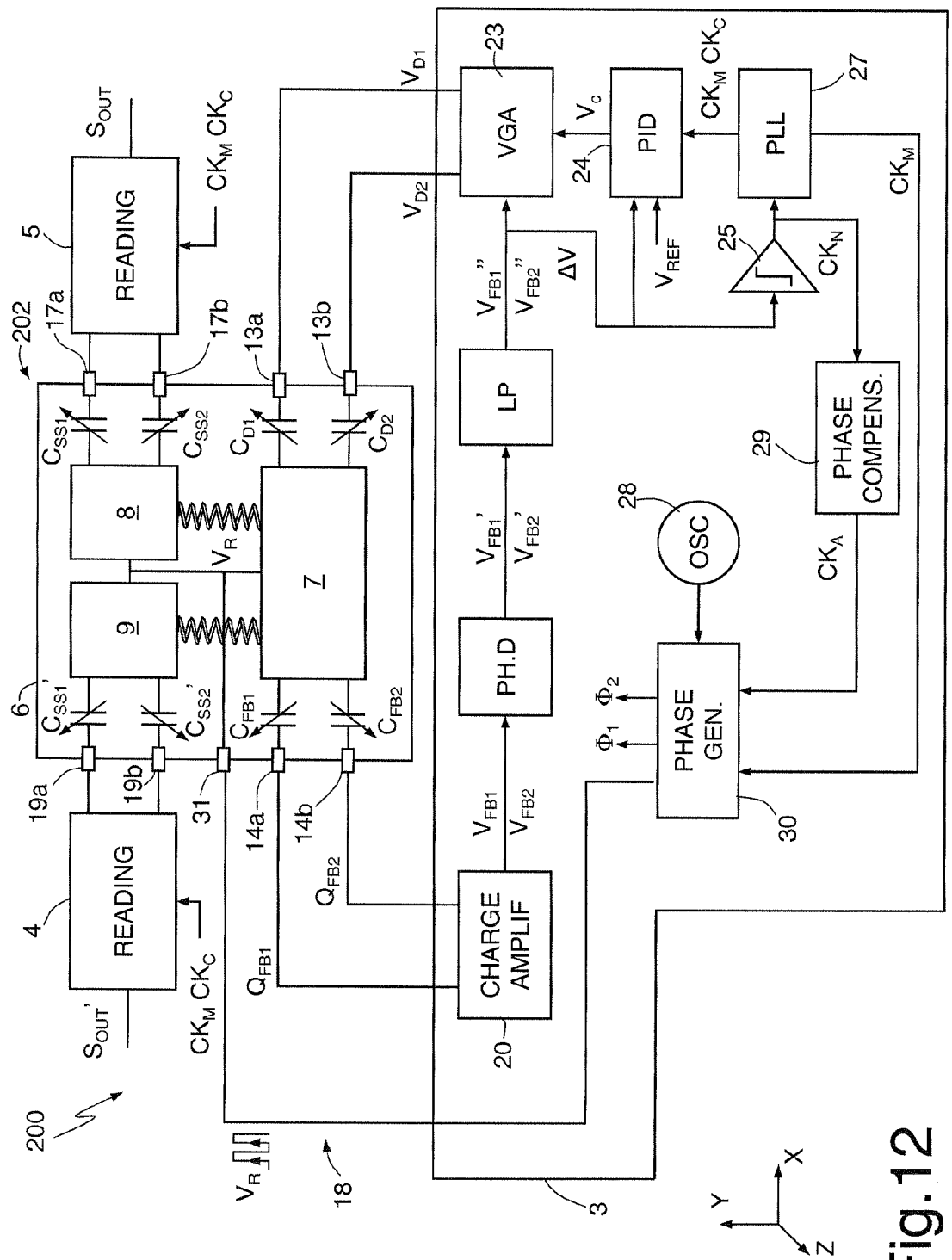
FIG. 12 is a simplified block diagram of a microelectromechanical gyroscope according to a third embodiment of the present disclosure.
Figure 13:
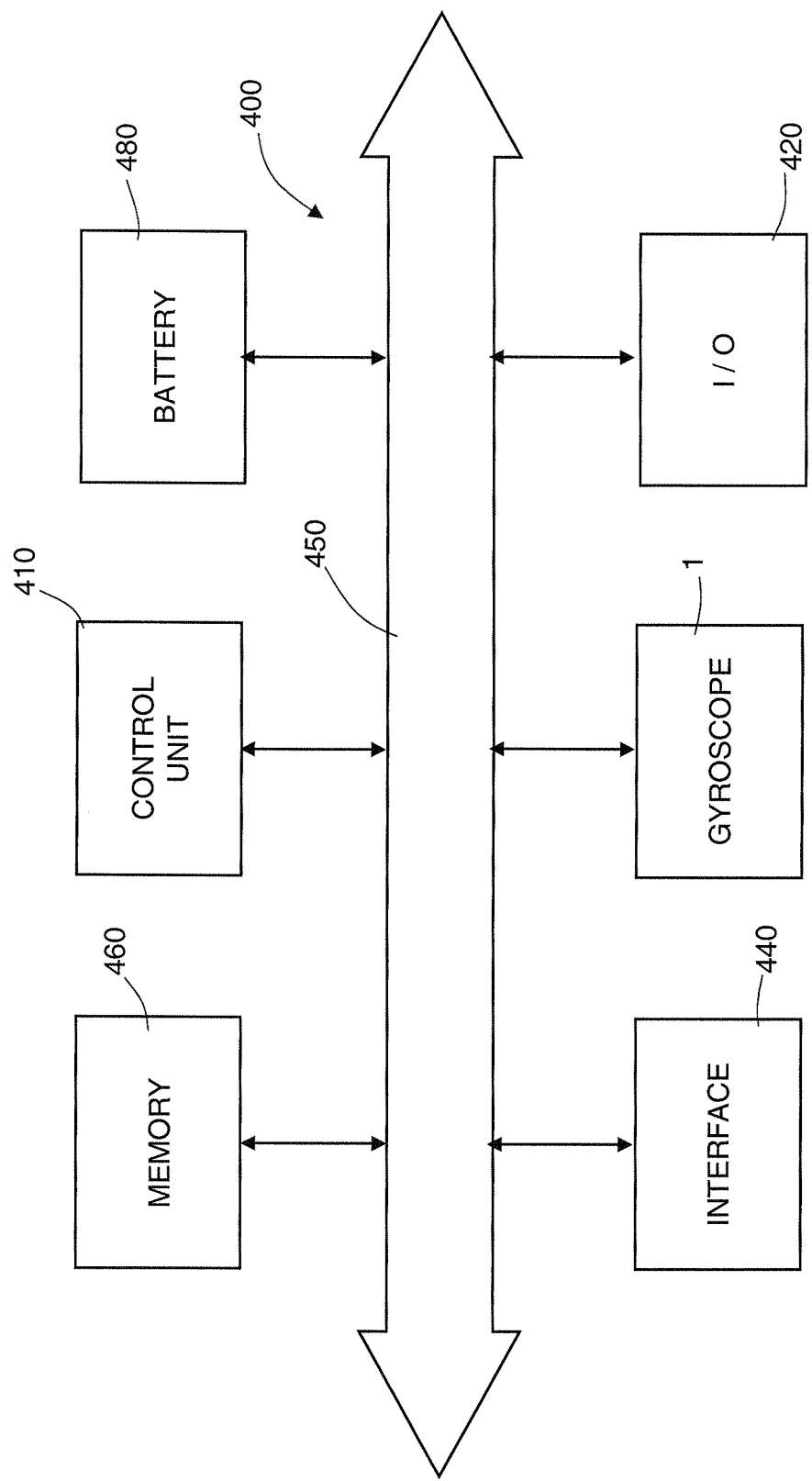
FIG. 13 is a simplified block diagram of an electronic system incorporating a microelectromechanical gyroscope according to one embodiment of the present disclosure.

Illustrated in FIG. 12 is a portion of an electronic system 400 according to one embodiment of the present disclosure. The system 400 incorporates the gyroscope 1 and can be used in devices, such as, for example, a palm-top computer (personal digital assistant, PDA), a laptop or portable computer, possibly with wireless capacity, a cell phone, a messaging device, a digital music player, a digital camera or other devices designed to process, store, transmit or receive information. For example, the gyroscope 1 can be used in a digital camera for detecting movements and perform an image stabilization. In other embodiments, the gyroscope 1 is included in a portable computer, a PDA, or a cell phone for detecting a free-fall condition and activating a safety configuration. In a further embodiment, the gyroscope 1 is included in a movement-activated user interface for computers or consoles for videogames.

The electronic system 400 may comprise a controller 410, an input/output (I/O) device 420 (for example a keyboard or a display), the gyroscope 1, a wireless interface 440 and a memory 460, of a volatile or non-volatile type, coupled to one another through a bus 450. In one embodiment, a battery 480 may be used for supplying the system 400. It should be noted that the scope of the present disclosure is not limited to embodiments having necessarily one or all of the devices listed.

The controller 410 may comprise, for example, one or more microprocessors, microcontrollers, and the like.

The I/O device 420 may be used for generating a message. The system 400 may use the wireless interface 440 for transmitting and receiving messages to and from a wireless-communication network with a radiofrequency (RF) signal. Examples of wireless interface may comprise an antenna, and a wireless transceiver, such as a dipole antenna, even though the field of the present disclosure is not limited from this point of view. In addition, the I/O device 420 may supply a voltage representing what is stored either in the form of digital output (if digital information has been stored) or in the form of analog output (if analog information has been stored).

Finally, it is clear that modifications and variations may be made to the gyroscope and to the method described, without thereby departing from the scope of the present disclosure, as defined in the annexed claims.

In the first place, the gyroscope could have any different micromechanical structure. For example, the disclosure may be advantageously exploited in: gyroscopes with one or more sensing masses that are linearly movable with respect to the driving mass and sensitive to rotations of pitch and/or roll (in addition to yaw); gyroscopes with cantilever sensing masses or ones shaped like beams oscillating about centroidal or non-centroidal axes; and uniaxial and multiaxial gyroscopes with angularly oscillating driving mass.

In addition, it is clearly possible to use a different number of timing signals, with different phase relations, to perform driving of the microelectromechanical loop (in particular, for implementing the CDS function), as required by the structure of the individual components.

The invention claimed is:

1. A microelectromechanical device comprising:
a microstructure including a fixed structure and a driving mass movable with respect to the fixed structure with a first degree of freedom according to a driving axis; and
a sensing device forming a microelectromechanical loop with the microstructure, the microelectromechanical loop being configured to keep the driving mass in oscillation according to the driving axis at a driving frequency; wherein the sensing device comprises:
a discrete-time sensing interface coupled to the microstructure and configured to sense a discrete-time position of the driving mass with respect to the driving axis, the sensing interface including a discrete-time charge amplifier configured to sense the discrete-time position of the driving mass and provide a discrete-time detection signal that indicates the discrete-time position of the driving mass; and
a controller configured to control an oscillation amplitude of the microelectromechanical loop based on the discrete-time detection signal that indicates the discrete-time position of the driving mass.

2. A device according to claim 1, wherein the discrete-time charge amplifier is a discrete-time fully-differential charge amplifier.

3. A device according to claim 2, wherein the microstructure includes feedback sensing terminals capacitively coupled to the driving mass and the charge amplifier has inputs respectively coupled to the feedback sensing terminals.

4. A device according to claim 1, wherein the charge amplifier comprises:
a fully-differential operational amplifier having first and second inputs and first and second outputs;
a first amplification capacitor coupled between the first input and the first output of the operational amplifier; and
a second amplification capacitor coupled between the second input and the second output of the operational amplifier.

5. A device according to claim 4, wherein the sensing interface comprises a correlated double-sampling (CDS) stage coupled to the first and second outputs of the operational amplifier.

6. A device according to claim 5, wherein the CDS stage comprises:
a first CDS capacitor having a first terminal, coupled to the first output of the operational amplifier, and a second terminal;

a second CDS capacitor having a first terminal, coupled to the second output of the operational amplifier, and a second terminal;

a first CDS switch configured to selectively couple the second terminal of the first CDS capacitor to a reference line configured to be set at a reference voltage; and a second CDS switch configured to selectively couple the second terminal of the second CDS capacitor to the reference line.

7. A device according to claim 6, wherein the CDS switches are configured to be controlled so as to be closed in an offset sampling step and open in a sensing step of a correlated double sampling cycle.

8. A device according to claim 7, wherein the CDS stage comprises a reset switch coupled between the first and second outputs of the operational amplifier and configured to be closed in a reset step and open in the offset sampling step and in the sensing step.

9. A device according to claim 1, wherein the controller comprises a phase shift module cascaded to the charge amplifier and configured to receive the discrete-time detection signal and produce a continuous-time phase-shifted detection signal having a phase shift in a range of 90°±40°.

10. A device according to claim 9, wherein the controller comprises a low-pass filter arranged downstream of the phase shift module, having a passband that includes the driving frequency, and configured to reduce from the continuous-time phase-shifted detection signal undesired signal components at least 30 dB.

11. A device according to claim 10, wherein the controller comprises:

a variable gain amplifier configured to produce a continuous-time driving signal based on the continuous-time phase-shifted detection signal and drive the driving mass with the continuous-time driving signal; and a control device configured to control a gain of the variable gain amplifier so as to maintain oscillation conditions of the microelectromechanical loop.

12. A method, comprising:

controlling a microelectromechanical device provided with a microstructure that includes a fixed structure, and a driving mass movable with respect to the fixed structure with a first degree of freedom according to a driving axis, the controlling including:

discrete-time sensing a discrete-time position of the driving mass with respect to the driving axis, the discrete-time sensing including producing a discrete-time detection signal that indicates the discrete-time position of the driving mass;

converting the discrete-time detection signal to a continuous-time detection signal; and controlling an oscillation amplitude of the driving mass based on the continuous-time detection signal.

13. A method according to claim 12, wherein the sensing comprises sensing using a discrete-time fully-differential charge amplifier that produces the discrete-time detection signal.

14. A method according to claim 12, comprising sensing displacements of a sensing mass that is coupled to the driving mass.

15. A method according to claim 14, comprising:

detecting an oscillation phase of a microelectromechanical loop that includes the driving mass;

generating a reading signal based on the detected oscillation phase, the reading signal having a frequency that is a multiple of the driving frequency, and transmitting the reading signal to the driving mass.

16. A system comprising:

a control unit; and a microelectromechanical device coupled to the control unit and configured to be controlled by the control unit, the device including:

a microstructure including a fixed structure and a driving mass movable with respect to the fixed structure with a first degree of freedom according to a driving axis; and a sensing device forming a microelectromechanical loop with the microstructure, the microelectromechanical loop being configured to keep the driving mass in oscillation according to the driving axis at a driving frequency; wherein the sensing device comprises:

a discrete-time sensing interface coupled to the microstructure and configured to sense a discrete-time position of the driving mass with respect to the driving axis, the sensing interface including a discrete-time charge amplifier configured to sense the discrete-time position and provide a discrete-time detection signal that indicates the discrete-time position of the driving mass; and a controller configured to control an oscillation amplitude of the microelectromechanical loop based on the discrete-time detection signal that indicates the discrete-time position of the driving mass.

17. A system according to claim 16, wherein the charge amplifier comprises:

a fully-differential operational amplifier having first and second inputs and first and second outputs;

a first amplification capacitor coupled between the first input and the first output of the operational amplifier; and a second amplification capacitor coupled between the second input and the second output of the operational amplifier.

18. A system according to claim 17, wherein the sensing interface comprises a correlated double-sampling (CDS) stage coupled to the first and second outputs of the operational amplifier.

19. A system according to claim 18, wherein the CDS stage comprises;

a first CDS capacitor having a first terminal, coupled to the first output of the operational amplifier, and a second terminal;

a second CDS capacitor having a first terminal, coupled to the second output of the operational amplifier, and a second terminal;

a first CDS switch configured to selectively couple the second terminal of the first CDS capacitor to a reference line configured to be set at a reference voltage; and a second CDS switch configured to selectively couple the second terminal of the second CDS capacitor to the reference line.

20. A system according to claim 19, wherein the CDS stage comprises a reset switch coupled between the first and second outputs of the operational amplifier and configured to be closed in a reset step and open in an offset sampling step and in a sensing step.

21. A system according to claim 16, wherein the controller comprises a phase shift module cascaded to the charge amplifier and configured to receive the discrete-time detection signal and produce a continuous-time phase-shifted detection signal having a phase shift in a range of 90°±40°.

22. A system according to claim 16, wherein the controller comprises:

a variable gain amplifier configured to produce a continuous-time driving signal based on the continuous-time phase-shifted detection signal and drive the driving mass with the continuous-time driving signal; and a control device configured to control a gain of the variable gain amplifier so as to maintain oscillation conditions of the microelectromechanical loop.

23. A sensing device comprising:

a discrete-time sensing interface configured to sense a discrete-time position of a driving mass with respect to a driving axis and produce a discrete-time detection signal that indicates the discrete-time position of the driving mass, the driving mass being part of a microstructure that includes a fixed structure, and the driving mass is movable with respect to the fixed structure with a first degree of freedom according to a driving axis;

a converter configured to convert the discrete-time detection signal to a continuous-time detection signal; and a driving amplifier coupled to the converter and configured to control an oscillation amplitude of the driving mass based on the continuous-time detection signal.

24. A sensing device according to claim 23, wherein the sensing interface comprises a discrete-time fully-differential charge amplifier configured to produce the discrete-time detection signal.

25. A sensing device according to claim 24, wherein the charge amplifier includes a fully-differential operational amplifier that includes:

first and second inputs and first and second outputs, a first amplification capacitor coupled between the first input and the first output of the operational amplifier; and a second amplification capacitor coupled between the second input and the second output of the operational amplifier.

26. A sensing device according to claim 25, wherein the sensing interface comprises a correlated double-sampling (CDS) stage coupled to the first and second outputs of the operational amplifier, the CDS stage including:

a first CDS capacitor having a first terminal, coupled to the first output of the operational amplifier, and a second terminal;

a second CDS capacitor having a first terminal, coupled to the second output of the operational amplifier, and a second terminal;

a first CDS switch configured to selectively couple the second terminal of the first CDS capacitor to a reference line configured to be set at a reference voltage; and a second CDS switch configured to selectively couple the second terminal of the second CDS capacitor to the reference line.

27. A sensing device according to claim 26, wherein the CDS switches are configured to be controlled so as to be closed in an offset sampling step and open in a sensing step of a correlated double sampling cycle.

28. A sensing device according to claim 27, wherein the CDS stage comprises a reset switch coupled between the first and second outputs of the operational amplifier and configured to be closed in a reset step and open in the offset sampling step and in the sensing step.

29. A sensing device according to claim 24, wherein the converter includes a phase shift module coupled between the sensing interface and the driving amplifier and configured to convert the discrete-time detection signal to a continuous-time detection signal and introduce a phase shift in a range of $90°\pm40°$.

30. A sensing device according to claim 24, further comprising a low-pass filter coupled between the sensing interface and the driving amplifier, having a passband that includes a driving frequency, and configured to reduce undesired signal components at least 30 dB.

31. A sensing device according to claim 24, wherein the driving amplifier is a variable gain amplifier, the sensing device further comprising a control device configured to control a gain of the variable gain amplifier so as to maintain oscillation conditions of the driving mass.

* * * * *